United States Patent

Swanson et al.

[11] Patent Number: 5,907,766
[45] Date of Patent: May 25, 1999

[54] METHOD OF MAKING A SOLAR CELL HAVING IMPROVED ANTI-REFLECTION PASSIVATION LAYER

[75] Inventors: Richard M. Swanson, Los Altos; Pierre J. Verlinden, Palo Alto; Ronald A. Sinton, San Jose, all of Calif.

[73] Assignee: Electric Power Research Institute, Inc., Palo Alto, Calif.

[21] Appl. No.: 08/732,765

[22] Filed: Oct. 21, 1996

[51] Int. Cl.$^6$ ................................................. H01L 31/0216
[52] U.S. Cl. ................................. 438/72; 427/74; 136/256
[58] Field of Search ............................. 427/419.2, 74; 438/38, 72; 136/261, 256

[56] References Cited

U.S. PATENT DOCUMENTS

| | | | |
|---|---|---|---|
| 3,614,548 | 10/1971 | Inoue | 317/234 |
| 4,239,810 | 12/1980 | Alameddine et al. | 427/75 |
| 4,389,534 | 6/1983 | Winterling | 136/256 |
| 4,479,027 | 10/1984 | Todorof | 136/249 |
| 4,492,813 | 1/1985 | Kausche et al. | 136/256 |
| 4,612,698 | 9/1986 | Gonsiorawski et al. | 29/572 |
| 4,642,414 | 2/1987 | Rasch et al. | 136/256 |
| 4,735,488 | 4/1988 | Rancourt et al. | 350/166 |
| 4,830,879 | 5/1989 | Debsikdar | 427/162 |
| 4,940,495 | 7/1990 | Weber et al. | 136/256 |
| 5,010,040 | 4/1991 | Vayman | 437/230 |
| 5,030,295 | 7/1991 | Swanson et al. | 136/256 |
| 5,106,671 | 4/1992 | Amberger et al. | 428/215 |
| 5,261,970 | 11/1993 | Landis et al. | 136/259 |
| 5,321,717 | 6/1994 | Adachi et al. | 372/100 |
| 5,338,370 | 8/1994 | Aoike | 136/258 |

FOREIGN PATENT DOCUMENTS

| | | | |
|---|---|---|---|
| 0022003 | 2/1984 | Japan | 427/419.2 |
| 0119274 | 5/1988 | Japan | 136/256 |

OTHER PUBLICATIONS

Tsaur et al., Efficient Si solar cells by low–temperature solid–phase epitaxy, Appl. Phys. Lett., vol. 39, No. 9, pp. 749–751, Nov. 1, 1981.

Yoldas et al., Antireflective coatings applied from metal–organic derived liquid precursors, Applied Optics, vol. 18, No. 18, pp. 3133–3138, Sep. 15, 1998.

B. E. Yoldas and T. W. O'Keefle, "Antireflective coatings applied from metal–organic derived liquid precursors," Applied Optics, Sep. 15, 1979, vol. 18, No. 18, pp. 3133–3138.

R. B. Pettit et al., "Sol–Gel double–layer antireflection coatings for silicon solar cells," Solar Cells, 15 (1985), Nov., pp. 267–278.

G. E. Jellison, Jr., and R. F. Wood, "Antireflection coatings for planar silicon solar cells," Solar Cells, 18 (1986), Aug., pp. 93–114.

*Primary Examiner*—Nam Nguyen
*Assistant Examiner*—Mike Miggins
*Attorney, Agent, or Firm*—Townsend and Townsend and Crew LLP; Henry K. Woodward

[57] ABSTRACT

A silicon solar cell has increased efficiency by providing an anti-reflection and passivation layer comprising a layer of silicon dioxide thermally grown on a surface of a silicon body and a layer of titanium dioxide deposited on the layer of silicon oxide. In fabricating the composite anti-reflection passivation layer, a layer of aluminum is first deposited on a surface of the thermally grown silicon oxide. After annealing the aluminum layer, the aluminum is removed from the silicon dioxide layer, and the layer of titanium dioxide is then deposited on the surface of the silicon dioxide from which the aluminum was removed. A layer of magnesium fluoride can be deposited on the surface of the titanium dioxide.

9 Claims, 1 Drawing Sheet

METHOD OF MAKING A SOLAR CELL HAVING IMPROVED ANTI-REFLECTION PASSIVATION LAYER

BACKGROUND OF THE INVENTION

This invention relates generally to silicon solar cells, and more particularly the invention relates to a solar cell having improved anti-reflective surface passivation.

The silicon solar cell generates electrical charge when exposed to solar radiation. The radiation interacts with atoms of the silicon and forms electrons and holes which migrate to p- and n-doped regions in the silicon body and create voltage differentials between doped regions.

Typically, the silicon body is coated with a silicon dioxide passivation layer. This layer may also serve as an anti-reflection layer to impinging radiation, or, alternatively, an additional anti-reflection coating can be applied over the passivation layer. Heretofore, a problem with oxide passivation layers has been a degradation of the surface recombination velocity at the silicon-silicon dioxide interface when exposed to concentrated sunlight. This effect is primarily due to hot electrons being created by the ultraviolet end of the solar spectrum and being injected from the silicon layer into the silicon dioxide layer.

U.S. Pat. No. 5,030,295 to Swanson, et al. discloses a stable passivation for silicon solar cells in which a thin silicon dioxide layer is capped by a thin polysilicon layer. Without the presence of the polysilicon, the surface is damaged by the ultraviolet portion of the solar spectrum, resulting in degradation of cell performance with time. The polysilicon is hypothesized to prevent such damage by virtue of either its absorption of the ultraviolet light or its prevention of water vapor diffusing through the thin silicon dioxide layer. Water is known to reduce the radiation hardness of silicon dioxide passivation.

The present invention is directed to a similar silicon solar cell which has an improved anti-reflection passivation layer and to a method of fabricating the passivation layer.

SUMMARY OF THE INVENTION

In accordance with the present invention, a titanium dioxide layer is provided over a surface of a silicon dioxide layer formed on a surface of a silicon solar cell and forms an improved anti-reflection passivation layer for the silicon solar cell. The titanium dioxide is more transparent to the desired portion of the solar spectrum while blocking the undesired portion including ultraviolet light.

In accordance with the invention, in fabricating the passivation layer, an aluminum film is first deposited on a surface of the silicon dioxide layer and then annealed. After annealing, the aluminum is removed from the silicon dioxide layer and the titanium dioxide is deposited on the surface.

The invention and object and features thereof will be more readily apparent from the following detailed description and appended claims when taken with the drawing.

DESCRIPTION OF THE PREFERRED EMBODIMENT

Figure 1:
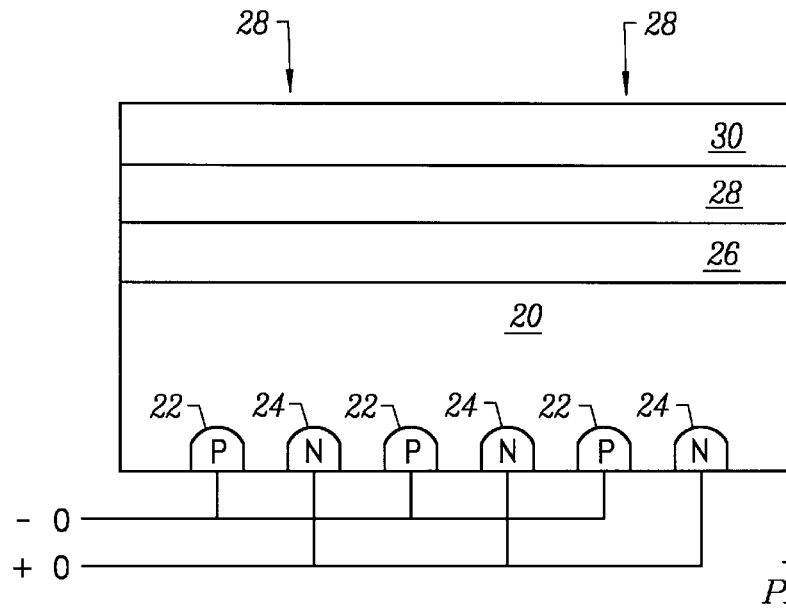
FIG. 1 is a section view of a silicon solar cell as disclosed in U.S. Pat. No. 5,030,295.

Referring now to the drawings, FIG. 1 is a section view of a conventional back contact silicon solar cell as disclosed in U.S. Pat. No. 5,030,295. The cell comprises a lightly doped or intrinsic silicon body 20 in which a plurality of p-doped regions 22 and n-doped regions 24 are all formed in a major surface thereof. The surface is normally provided with a passivating and reflecting layer to prevent radiation from passing through the silicon body and the escape of photons. The opposite surface of the silicon body 20 has a thin layer of silicon dioxide 26 grown thereon as a passivating layer. The silicon dioxide layer has a thickness on the order of 50 Å for anti-reflection purposes. The passivation layer further includes a phosphorus-doped polysilicon layer 28 and a thicker vapor deposited silicon dioxide layer 30. The thin silicon dioxide layer 26 improves the problem of water-related traps and produces less stress than thick silicon dioxide layers. The phosphorus-doped polycrystalline silicon layer 28 has a thickness on the order of 300 Å and provides for improving the stability of the passivation layer. It is believed that the function of the doped polysilicon layer is to prevent electrons from being injected into the silicon dioxide layer from the silicon substrate. Alternatively, interface states may be discouraged from being created even if electronic injection is occurring. While polycrystalline silicon is more absorptive of incoming light than is silicon dioxide, a polysilicon crystalline layer of 300 Å will absorb only about 3% of impinging light, which is a fair trade off for the increased stability offered thereby.

Figure 2:
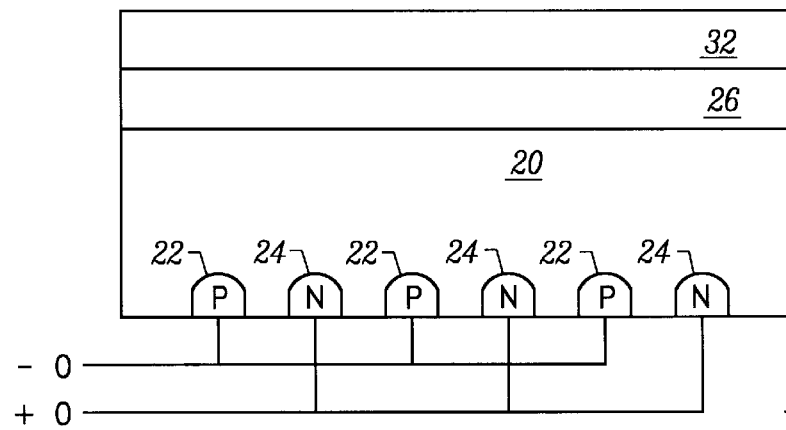
FIG. 2 is a section view of a silicon solar cell in accordance with the present invention.

FIG. 2 is a section view of a silicon solar cell as in FIG. 1, but with an improved passivating layer in accordance with the present invention. In this embodiment, the phosphorus-doped polycrystalline layer 28 and the thicker vapor deposited silicon dioxide layer 30 are replaced by a single layer 32 of titanium dioxide which is more transparent to the desired portion of the solar spectrum and also acts as an anti-reflection layer.

Energy loss in the anti-reflection passivation layer can be reduced from 9% for prior art layers to 2% for the titanium dioxide/silicon dioxide anti-reflection passivation layer in accordance with the invention. This greatly facilitates reaching the theoretical goal of 27.5% efficiency of the silicon solar cell in converting sunlight into electricity.

Figure 3:
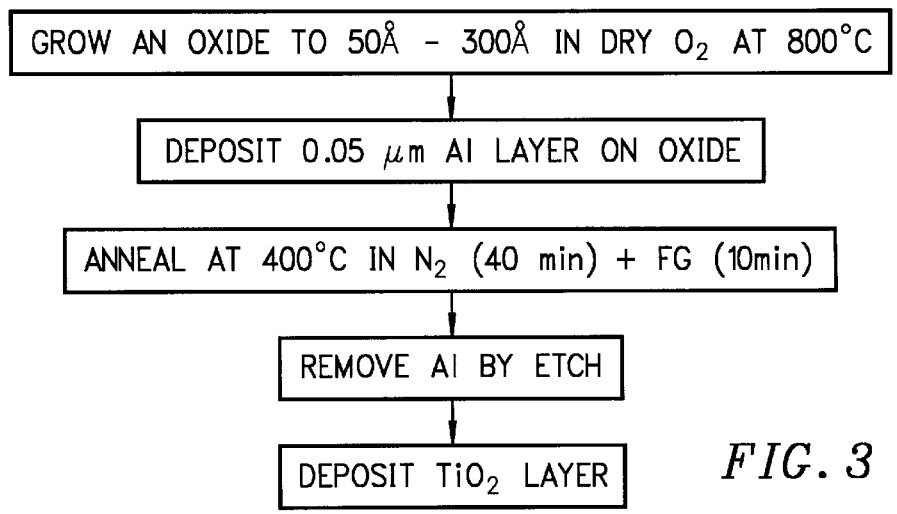
FIG. 3 is a flow diagram of a process in accordance with the invention and the fabricating the silicon solar cell of FIG. 2.

FIG. 3 is a process flow chart illustrating the steps in fabricating the silicon solar cell of FIG. 2. Initially, the silicon dioxide layer 26 is thermally grown on a surface of the silicon semiconductor body 20 to a thickness of 50 Å–300 Å in dry oxygen ($O_2$) at a temperature of 800° C. The silicon dioxide layer can be undoped or phosphorous doped as taught in U.S. Pat. No. 5,030,295. Thereafter, a layer of aluminum having a thickness of approximately 0.05 μm is deposited on a surface of the silicon dioxide layer 26. The structure is then annealed at 400° C. in nitrogen ($N_2$) for 40 minutes followed by annealing in a forming gas (20% hydrogen, 80% nitrogen) for 10 minutes. The structure is cooled down in the forming gas for 40 minutes and then the aluminum is removed by etching in a mixture of nitric and hydrofluoric acid ($HNO_3$:HF 240:1). The annealing of the aluminum hydrogenates the surface and reduces surface defects which enhances cell efficiency.

Thereafter, a layer 32 of titanium dioxide ($TiO_2$) having a thickness on the order of 500 Å is deposited on the textured surface of the silicon dioxide layer 26 from which the aluminum was removed. A layer of magnesium fluoride ($MgF_2$) having a thickness on the order of 1360 Å can be deposited on the surface of the titanium dioxide to form a second anti-reflection layer further reducing reflected light.

Use of the titanium dioxide and silicon dioxide layers as a composite anti-reflection and passivation layer maintains the reflection of impinging ultraviolet light while increasing the efficiency in passing the desired portion of the solar light spectrum. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating an anti-reflection passivation layer on a surface of a silicon solar cell comprising the steps of:
    (a) forming a silicon dioxide layer on said surface,
    (b) depositing a layer of aluminum on said silicon dioxide layer,
    (c) annealing said layer of aluminum and said layer of silicon dioxide,
    (d) removing said aluminum layer, and
    (e) forming a layer of titanium dioxide on said silicon dioxide layer.

2. The method as defined by claim 1, wherein step (b) includes depositing a layer of aluminum having a thickness of approximately 0.05 $\mu$m.

3. The method as defined by claim 2, wherein step (c) includes heating said silicon solar cell to a temperature of approximately 400° C. in nitrogen for 40 minutes followed by annealing in a forming gas for 10 minutes.

4. The method as defined by claim 1, wherein step (c) includes heating said silicon solar cell to a temperature at approximately 400° C.

5. The method as defined by claim 1 wherein step (a) includes thermally growing said silicon dioxide layer on said surface.

6. The method as defined by claim 5 wherein step (e) includes evaporatively depositing said layer of titanium dioxide on said silicon dioxide layer.

7. The method as defined by claim 6 wherein step (a) forms a silicon dioxide layer having a thickness in the range of 50 Å to 300 Å and, step (e) forms a layer of titanium dioxide having a thickness on the order of 500 Å.

8. The method as defined by claim 1 and further including the step of:
    (f) forming a layer of magnesium fluoride on said layer of titanium dioxide.

9. The method as defined by claim 8 wherein step (f) forms a layer of magnesium fluoride having a thickness in the range of 1300 Å to 1400 Å.

* * * * *